(12) United States Patent
Ong et al.

(10) Patent No.: US 11,158,568 B2
(45) Date of Patent: Oct. 26, 2021

(54) PACKAGE WITH WALL-SIDE CAPACITORS

(71) Applicant: Intel Corporation, Santa Clara, CA (US)

(72) Inventors: Jenny Shio Yin Ong, Bayan Lepas (MY); Seok Ling Lim, Kulim (MY)

(73) Assignee: Intel Corporation, Santa Clara, CA (US)

(*) Notice: Subject to any disclaimer, the term of this patent is extended or adjusted under 35 U.S.C. 154(b) by 3 days.

(21) Appl. No.: 16/341,963

(22) PCT Filed: Nov. 18, 2016

(86) PCT No.: PCT/US2016/062736
§ 371 (c)(1),
(2) Date: Apr. 15, 2019

(87) PCT Pub. No.: WO2018/093379
PCT Pub. Date: May 24, 2018

(65) Prior Publication Data
US 2019/0244883 A1 Aug. 8, 2019

(51) Int. Cl.
*H01L 23/498* (2006.01)
*H05K 1/11* (2006.01)
(Continued)

(52) U.S. Cl.
CPC .. *H01L 23/49805* (2013.01); *H01L 23/49816* (2013.01); *H01L 23/49822* (2013.01);
(Continued)

(58) Field of Classification Search
CPC ......... H01L 23/49816; H01L 23/49883; H01L 2924/15311; H01L 2924/19041;
(Continued)

(56) References Cited

U.S. PATENT DOCUMENTS 7,669,320 B2 * 3/2010 Hurwitz .............. H01L 21/4857
29/846
2007/0074389 A1 4/2007 Searls et al.
(Continued)

FOREIGN PATENT DOCUMENTS

JP 2016152234 8/2016

OTHER PUBLICATIONS

International Search Report and Written Opinion for International Patent Application No. PCT/US16/62736, dated Jul. 24, 2017.
(Continued)

*Primary Examiner* — Jasmine J Clark
(74) *Attorney, Agent, or Firm* — Essential Patents Group, LLP

(57) ABSTRACT

An apparatus is provided which comprises: a plurality of organic dielectric layers forming a substrate, a plurality of first conductive contacts on a top surface of the substrate, a plurality of second conductive contacts on a bottom surface of the substrate, a plurality of third conductive contacts on a side wall surface of the substrate, and one or more discrete capacitor(s) coupled with the third conductive contacts on the side wall surface. Other embodiments are also disclosed and claimed.

16 Claims, 8 Drawing Sheets

(51) Int. Cl.
*H05K 3/34* (2006.01)
*H01L 23/00* (2006.01)
*H05K 3/42* (2006.01)
*H05K 3/46* (2006.01)

(52) U.S. Cl.
CPC ........ H01L 23/49838 (2013.01); H01L 24/16 (2013.01); H05K 1/117 (2013.01); H05K 3/3405 (2013.01); *H01L 2224/16227* (2013.01); *H01L 2924/15311* (2013.01); *H01L 2924/19041* (2013.01); *H01L 2924/19101* (2013.01); *H05K 3/429* (2013.01); *H05K 3/4602* (2013.01); *H05K 3/4608* (2013.01); *H05K 2201/0959* (2013.01); *H05K 2201/09536* (2013.01)

(58) Field of Classification Search
CPC . H01L 2224/02331; H01L 2224/16227; H01L 2924/19101; H01L 23/498; H01L 23/49822; H01L 23/49838; H01L 24/16; H05K 3/4602; H05K 2201/09536; H05K 2201/0959; H05K 1/117; H05K 3/3405; H05K 3/429; H05K 3/4608

See application file for complete search history.

(56) References Cited

U.S. PATENT DOCUMENTS

| | | |
|---|---|---|
| 2012/0073131 A1* | 3/2012 | Miyazawa .......... H01L 21/4857 29/846 |
| 2013/0170154 A1 | 7/2013 | Lee et al. |
| 2014/0334120 A1 | 11/2014 | Dakhiya et al. |
| 2016/0079223 A1 | 3/2016 | Wu |

OTHER PUBLICATIONS

International Preliminary Report on Patentability for PCT Application No. PCT/US16/62736, dated May 31, 2019.

* cited by examiner

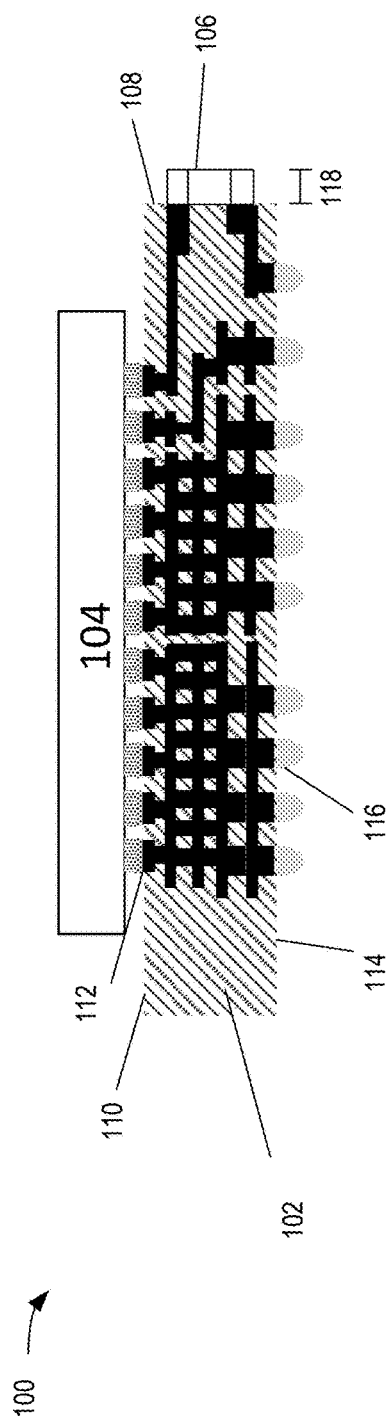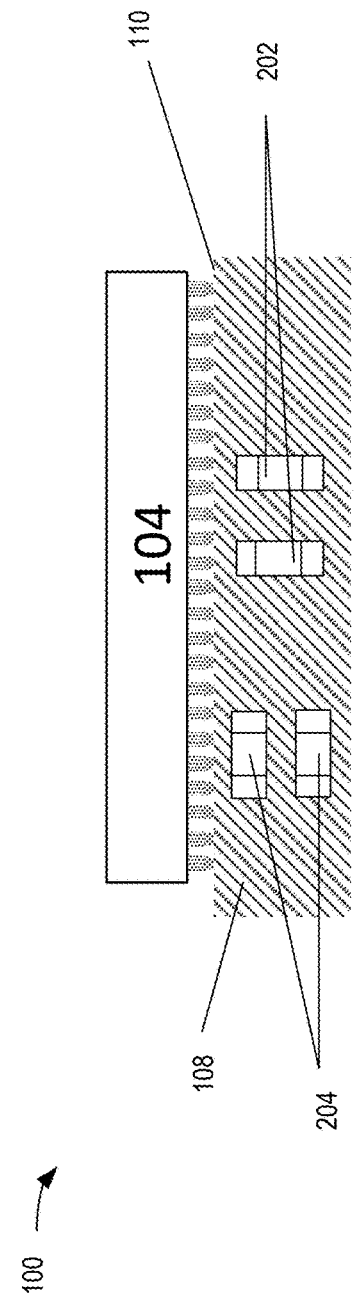
Fig. 1
Fig. 2

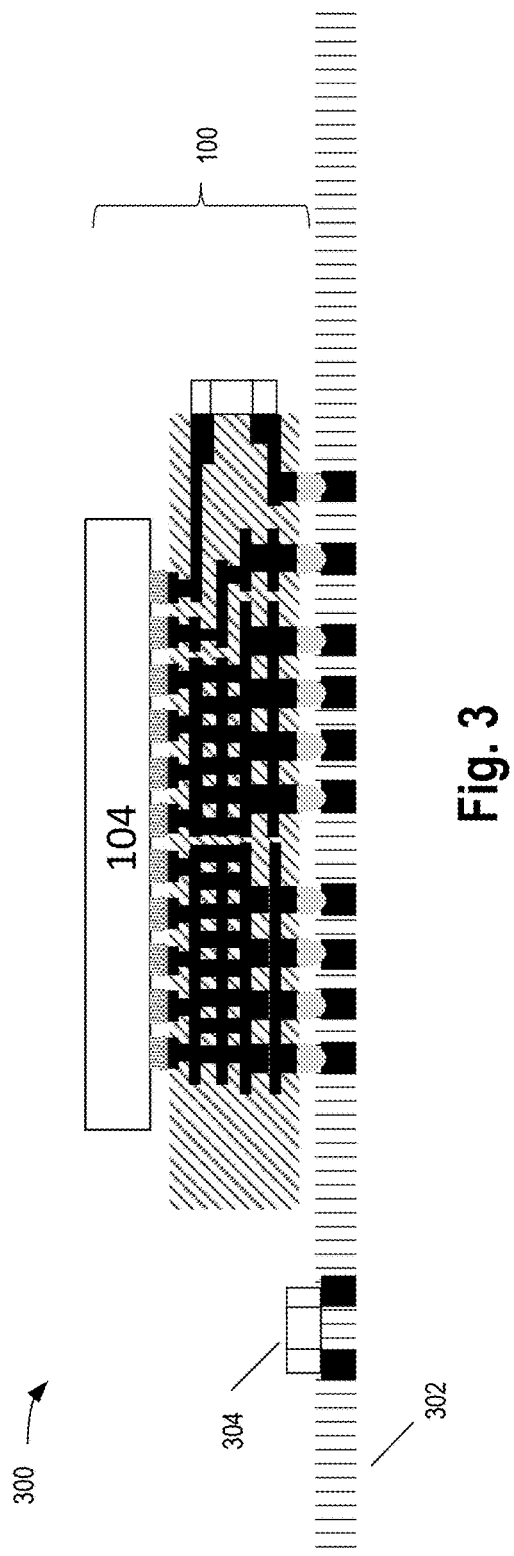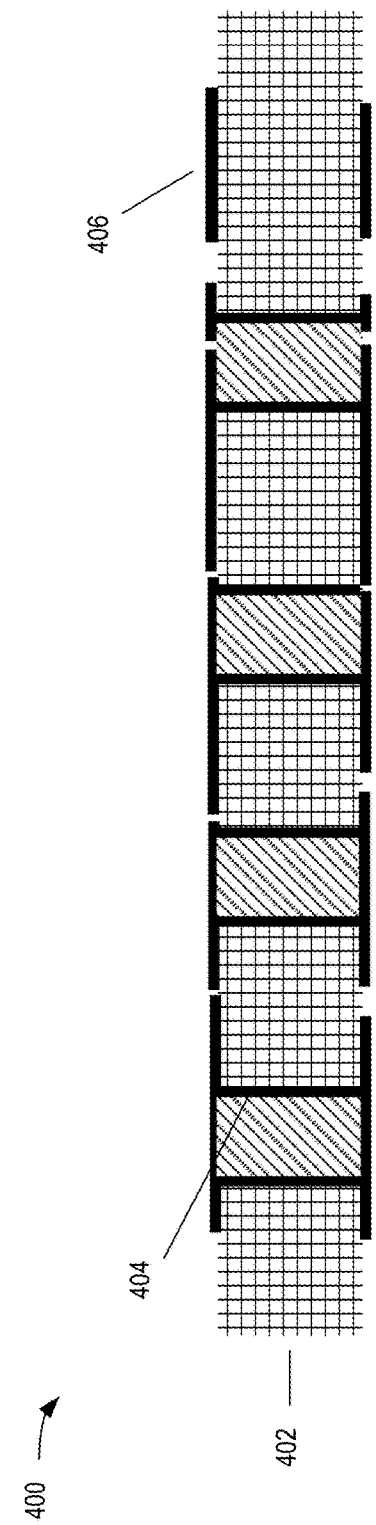
Fig. 3
Fig. 4

PACKAGE WITH WALL-SIDE CAPACITORS

CLAIM OF PRIORITY

This Application is a National Stage Entry of, and claims priority to, PCT Application No. PCT/US16/62736, filed on 18 Nov. 2016 and titled "PACKAGE WITH WALL-SIDE CAPACITORS", which is incorporated by reference in its entirety for all purposes.

BACKGROUND

Integrated circuit device package solutions generally include capacitors on the die side and/or the land side for power delivery. However, die side capacitors can be constrained by available package routing space and land side capacitors can be limited by socket space and ball pitch. Also, as devices and packages continue to shrink in size, the possibilities for capacitor type and real estate for capacitor placement becomes more problematic. Removing capacitors from device packages and placing them nearby on the associated printed circuit board would tend to complicate and increase board space requirements.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 1 illustrates a cross-sectional view of a package with wall-side capacitors, according to some embodiments, FIG. 2 illustrates a side view of a package with wall-side capacitors, according to some embodiments, FIG. 3 illustrates a cross-sectional view of a system with a package with wall-side capacitors, according to some embodiments, FIG. 4 illustrates a cross-sectional view of a manufacturing step of a package with wall-side capacitors, according to some embodiments.

DETAILED DESCRIPTION

Figure 5:
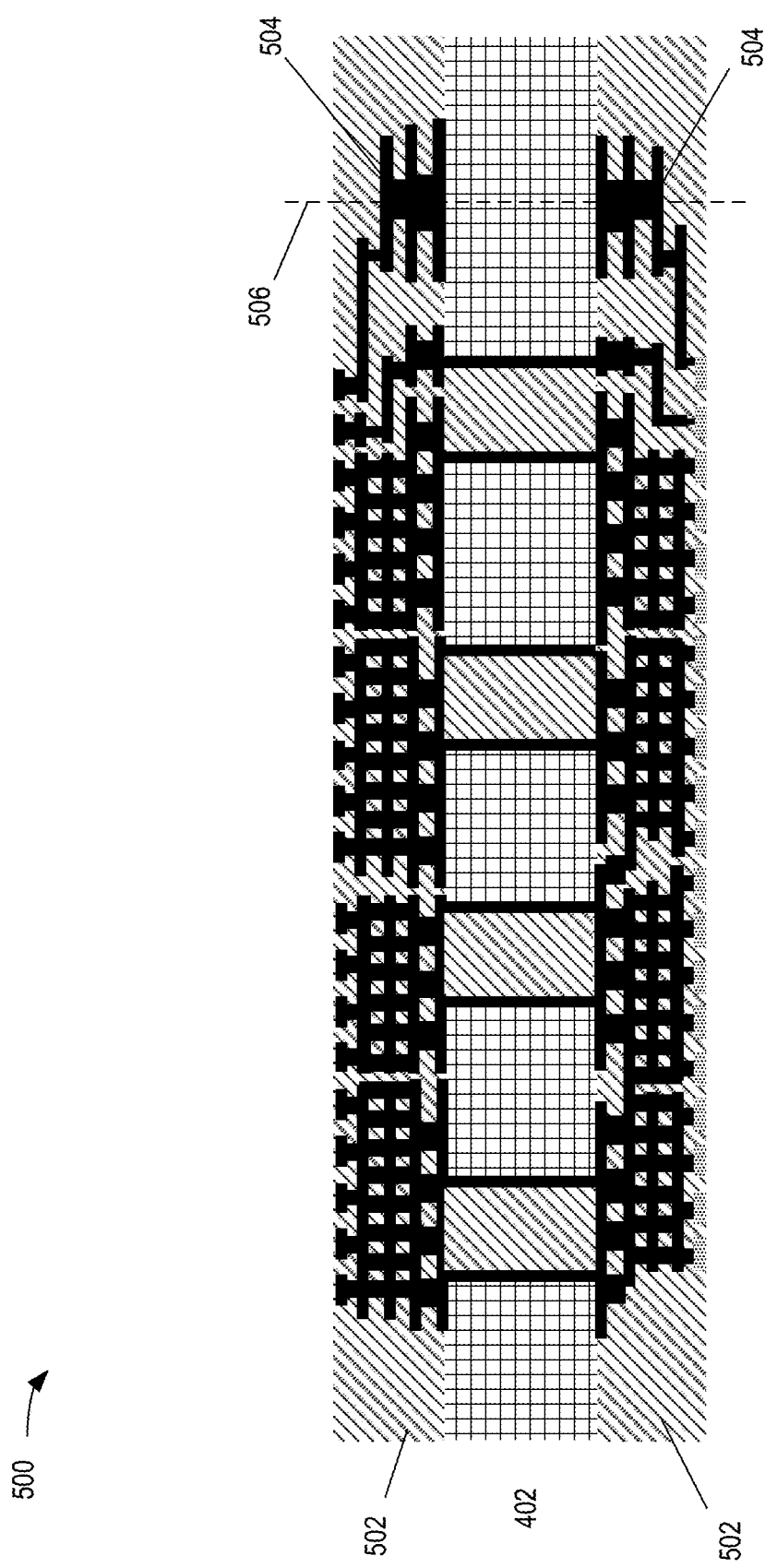
FIG. 5 illustrates a cross-sectional view of a manufacturing step of a package with wall-side capacitors, according to some embodiments.

Integrated circuit packages with wall-side capacitors are generally presented. In this regard, embodiments of the present invention enable wall-side capacitors that previously may have been located on a die side or a land side of a package. One skilled in the art would appreciate that these wall-side capacitors may enable more conventional, less expensive surface mount capacitors. Additionally, wall-side capacitors may provide better use of previously vacant space while being able to limit overall z-height of a system, which may be an important consideration in certain applications.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices. The term "coupled" means a direct or indirect connection, such as a direct electrical, mechanical, or magnetic connection between the things that are connected or an indirect connection, through one or more passive or active intermediary devices. The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

FIG. 1 illustrates a cross-sectional view of a package with wall-side capacitors, according to some embodiments. As shown, package 100 includes substrate 102, die 104, capacitor 106, side wall surface 108, top surface 110, top contacts 112, bottom surface 114, bottom contacts 116, and capacitor height 118.

While shown as including a single die 104, package 100 can include multiple devices of similar or different types of integrated circuit devices. For example, die 104 can be any of application processors, graphics processors, field programmable gate arrays (FPGA), input/output (I/O) controllers, network controllers, or memory devices, among other devices. Die 104 is coupled with top contacts 112 on top surface 110 of substrate 102. Substrate 102 may comprise a plurality of organic dielectric layers with vertical and horizontal copper, or other conductive material, disposed therein. Bottom contacts 116 on bottom surface 114 (opposite of top surface 110) may enable package 100 to be coupled with a printed circuit board and may include ball grid array (BGA) or land grid array (LGA) contacts, for example.

Capacitor 106 may be coupled with side wall surface 108 (perpendicular to top surface 110 and bottom surface 114) as part of a power delivery solution in lieu of being located on top surface 110 or bottom surface 114. In some embodiments, capacitor 106 is a discrete surface-mount device (SMD). In some embodiments, capacitor 106 is a standard 0402 metric (0.4 mm×0.2 mm) package, though other size and types of capacitors may be used. In some embodiments, capacitor 106 has a capacitor height 118 of greater than about 200 um.

FIG. 2 illustrates a side view of a package with wall-side capacitors, according to some embodiments. As shown, package 100 includes die 104, side wall surface 108, top surface 110, vertical capacitors 202, and horizontal capacitors 204.

While shown as including both vertical capacitors 202 (with a long edge perpendicular to top surface 110) and horizontal capacitors 204 (with a long edge parallel to top surface 110), in some embodiments package 100 may include just one orientation of wall-side capacitors. Also, while shown as including two stacked rows of horizontal capacitors 204, package 100 may include staggered multiple rows of horizontal capacitors 204, or may include just a single row of horizontal capacitors 204.

FIG. 3 illustrates a cross-sectional view of a system with a package with wall-side capacitors, according to some embodiments. As shown, system 300 includes package 100, printed circuit board 302, and board edge capacitor 304. Printed circuit board 302 may couple package 100 with components of system 300, for example as shown hereinafter in reference to FIG. 10. While embodiments of the present invention enable packages with wall-side capacitors, other capacitors, such as board edge capacitor 304, or package die side or land side capacitors may also be present.

FIG. 4 illustrates a cross-sectional view of a manufacturing step of a package with wall-side capacitors, according to some embodiments. As shown, substrate 400 includes substrate core 402, plated through holes 404, and plated surface 406. Substrate core 402 may be of any substance that provides mechanical stability, such as for example metal foil. Substrate core 402 may include insulator or conductor material. In some embodiments, plated through holes 404 are formed in substrate core 402 to include conductive walls that are filled with insulator material. Plated surfaces 406 may be included on substrate core 402 as part of a via formation as shown in more detail hereinafter.

FIG. 5 illustrates a cross-sectional view of a manufacturing step of a package with wall-side capacitors, according to some embodiments. As shown, substrate 500 includes substrate core 402, dielectric layers 502, vias 504, and imaginary line 506.

Dielectric layers 502 may be iteratively built-up upon substrate core 402, for example by lamination or deposition, with the formation of copper features to form conductive contacts and interconnects. Vias 504 may be formed that extend beyond imaginary line 506, that represents where a substrate will be cut to form a side.

Figure 6:
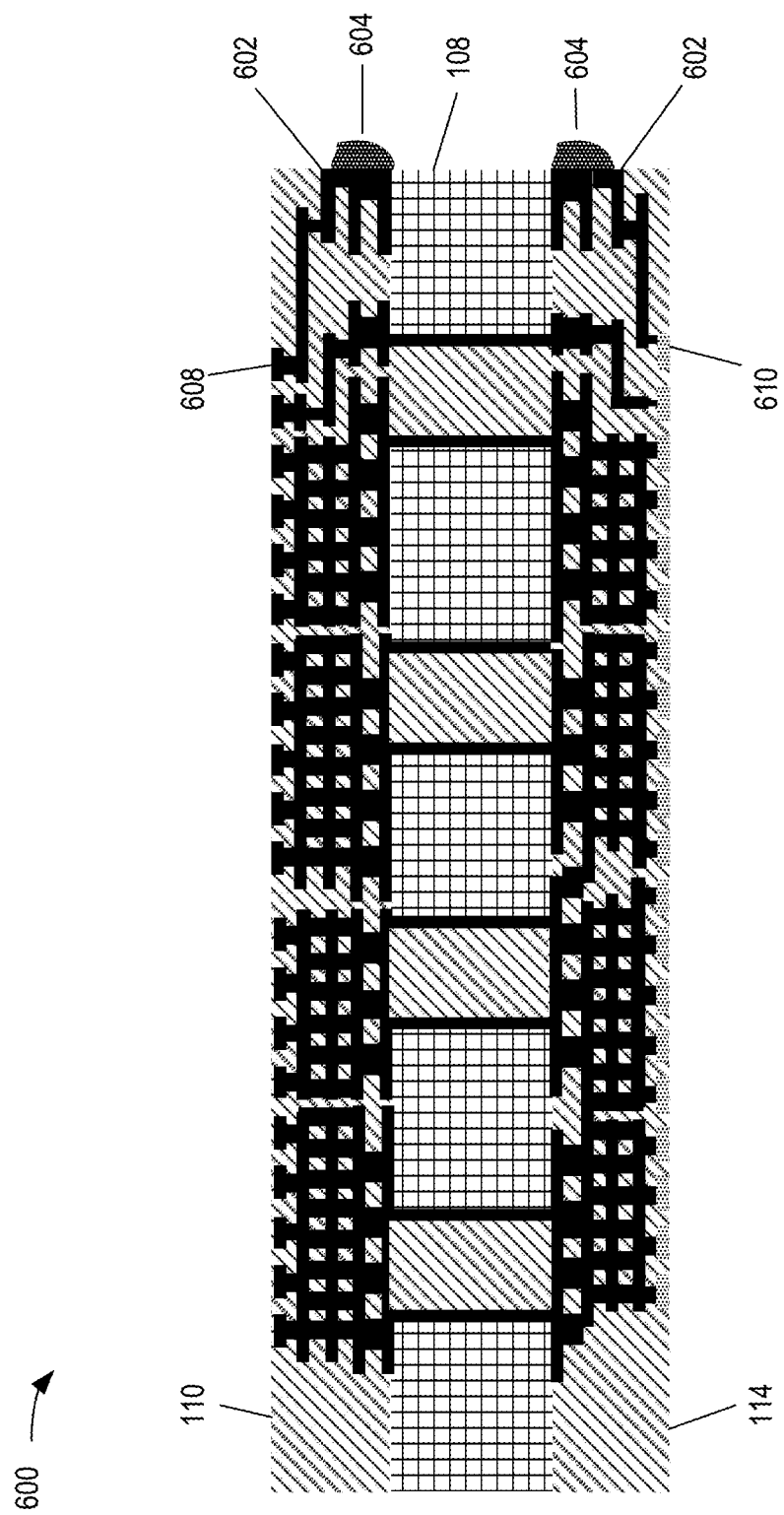
FIG. 6 illustrates a cross-sectional view of a manufacturing step of a package with wall-side capacitors, according to some embodiments.

FIG. 6 illustrates a cross-sectional view of a manufacturing step of a package with wall-side capacitors, according to some embodiments. As shown, substrate 600 includes side wall surface 108, top surface 110, bottom surface 114, wall-side contacts 602, conductive paste 604, top contact 608, and bottom contact 610. Wall-side contacts 602 may have been formed on side wall surface 108 from severing vias 504 along imaginary line 506, for example by sawing, etching, grinding, or laser cutting.

In some embodiments, wall-side contacts 602, which may be made from copper, are plated with conductive paste 604. In some embodiments, conductive paste 604 is a lead-free solder paste, for example a tin alloy solder.

While most contacts on top surface 110 may couple with a contact on bottom surface 114, top contact 608 and bottom contact 610 may include electrical paths that extend only so far as side wall surface 108. At this point, the connection between top contact 608 and bottom contact 610 would be an open circuit spanning across substrate core 402.

Figure 7:
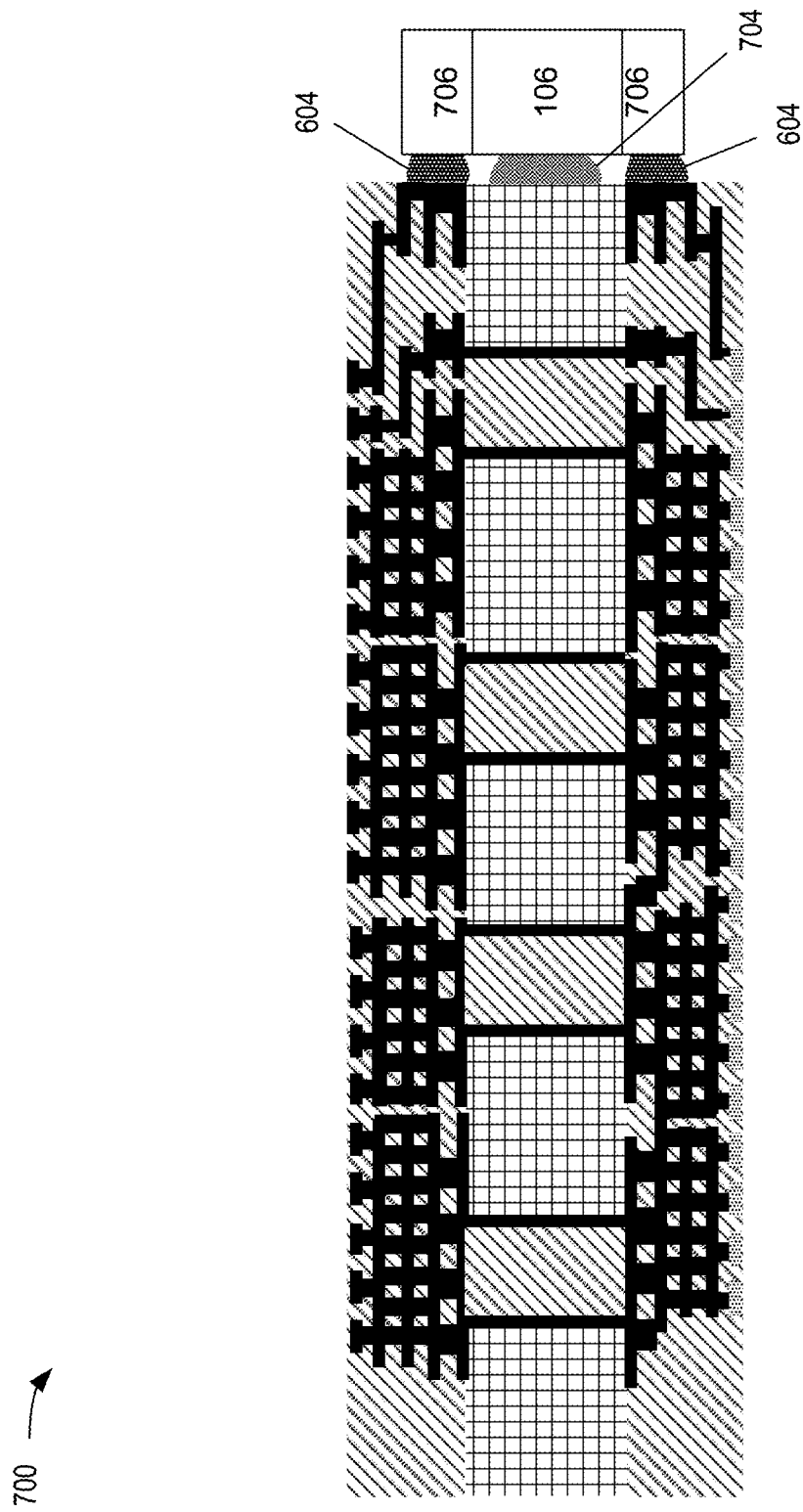
FIG. 7 illustrates a cross-sectional view of a package substrate with wall-side capacitors, according to some embodiments.

FIG. 7 illustrates a cross-sectional view of a package substrate with wall-side capacitors, according to some embodiments. As shown, substrate 700 includes capacitor 106, conductive paste 604, adhesive 704, and capacitor ends 706. Capacitor 106 may complete an electrical connection between top contact 608 and bottom contact 610.

Capacitor 106 may include conductive ends 706 that are placed in conductive contact with wall-side contacts 602 via conductive paste 604. In some embodiments, conductive paste 604 is not separated included and may instead be built into capacitor ends 706. In some embodiments, conductive paste 604, when included, may not have strong adhesive properties before being cured, and adhesive 704 may be included to hold capacitor 106 in place along side wall surface 108. In some embodiments, adhesive 704 may be an air cured epoxy or glue.

Figure 8:
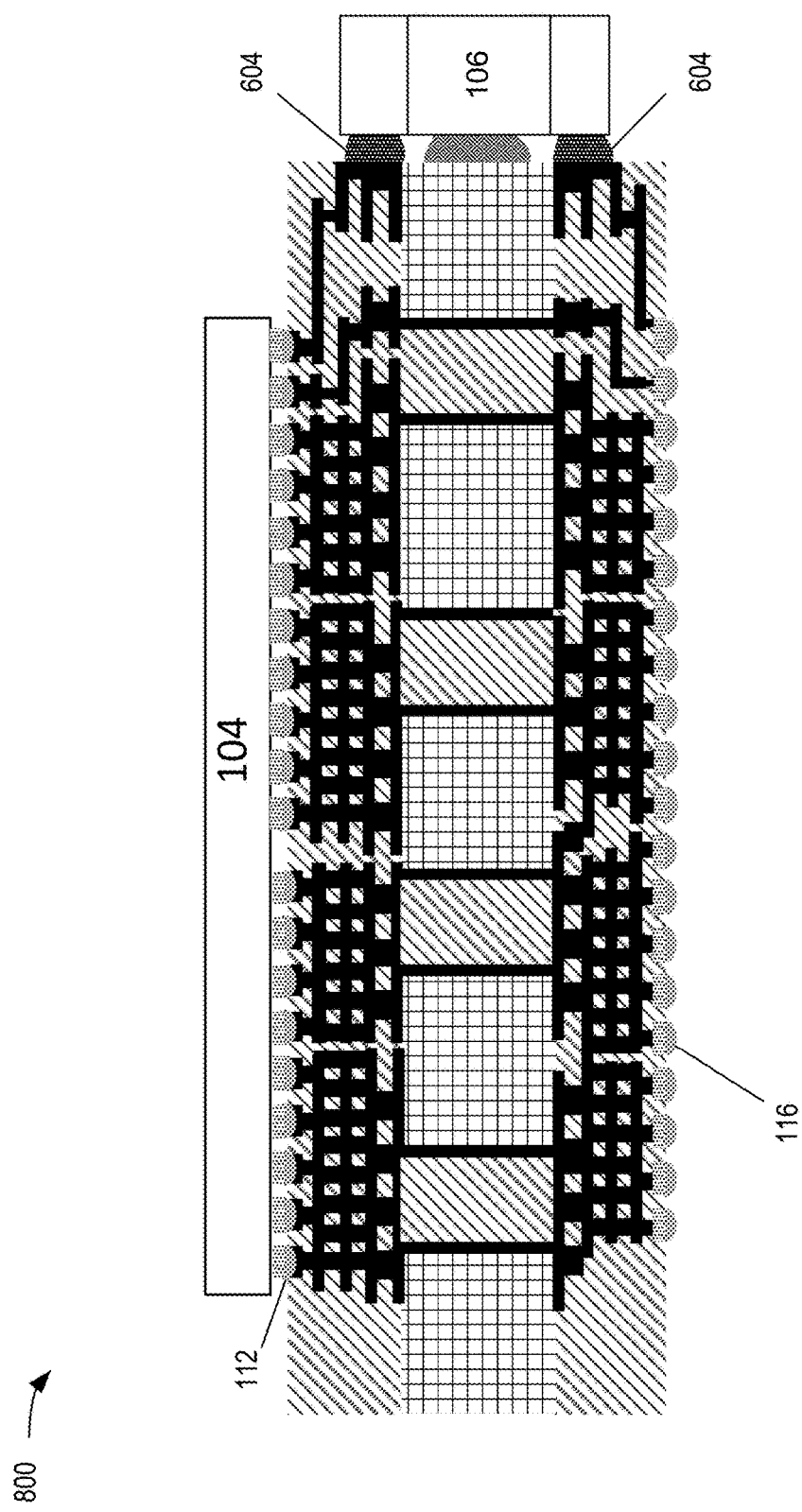
FIG. 8 illustrates a cross-sectional view of a package with wall-side capacitors, according to some embodiments.

FIG. 8 illustrates a cross-sectional view of a package with wall-side capacitors, according to some embodiments. As shown, package 800 includes die 104, capacitor 106, top contacts 112, bottom contacts 116, and conductive paste 604. In some embodiments, die 104 may have been attached to substrate 102 before capacitor 106.

In some embodiments, conductive paste 604 is heated in order for it to cure. In various embodiments, conductive paste 604 may be heated by hot gas convection or infrared radiation, for example. In some embodiments, heating of conductive paste 604 coincides with attachment of die 104 with top contacts 112 and formation of bottom contacts 116, which may include solder balls.

Figure 9:
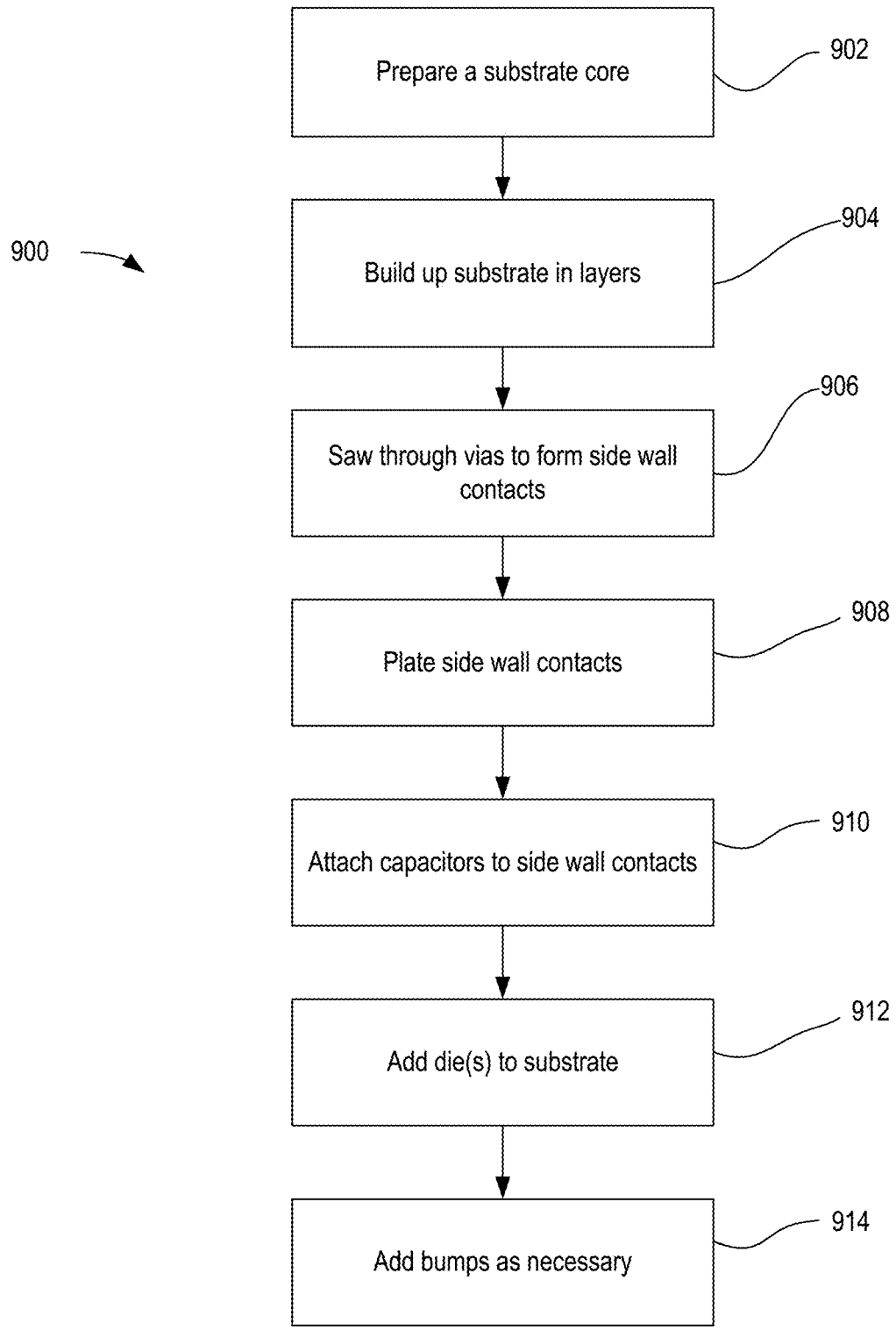
FIG. 9 illustrates a flowchart of a method of forming a package with wall-side capacitors, in accordance with some embodiments.

FIG. 9 illustrates a flowchart of a method of forming a package with wall-side capacitors, in accordance with some embodiments. Although the blocks in the flowchart with reference to FIG. 9 are shown in a particular order, the order of the actions can be modified. Thus, the illustrated embodiments can be performed in a different order, and some actions/blocks may be performed in parallel. Some of the blocks and/or operations listed in FIG. 9 are optional in accordance with certain embodiments. The numbering of the blocks presented is for the sake of clarity and is not intended to prescribe an order of operations in which the various blocks must occur. Additionally, operations from the various flows may be utilized in a variety of combinations.

Method 900 begins with preparing (902) substrate core 402, if one will be used. In some embodiments, plating and drilling occurs to form plated through holes 404 and plated surface 406. Next, dielectric layers 502 are built up (904) on substrate core 402. In some embodiments, the iterative forming of organic dielectric layers with copper interconnects includes several layers, and forms vias 504.

Then, wall-side contacts 602 are formed by sawing/severing (906) through vias 504 along imaginary line 506. Next, in some embodiments, wall-side contacts 602 are plated (908) with conductive paste 604.

The method continues with attaching (910) capacitor 106 to wall-side contacts 602. In some embodiments, adhesive 704 is applied either to side wall surface 108 or capacitor 106 before placing the two together. Next, one or more die 104 are attached (912) to substrate 102. Finally, to the extent they are necessary, bumps, such as ball grid array (BGA) bumps, would be added (914) to the bottom of package 100.

Figure 10:
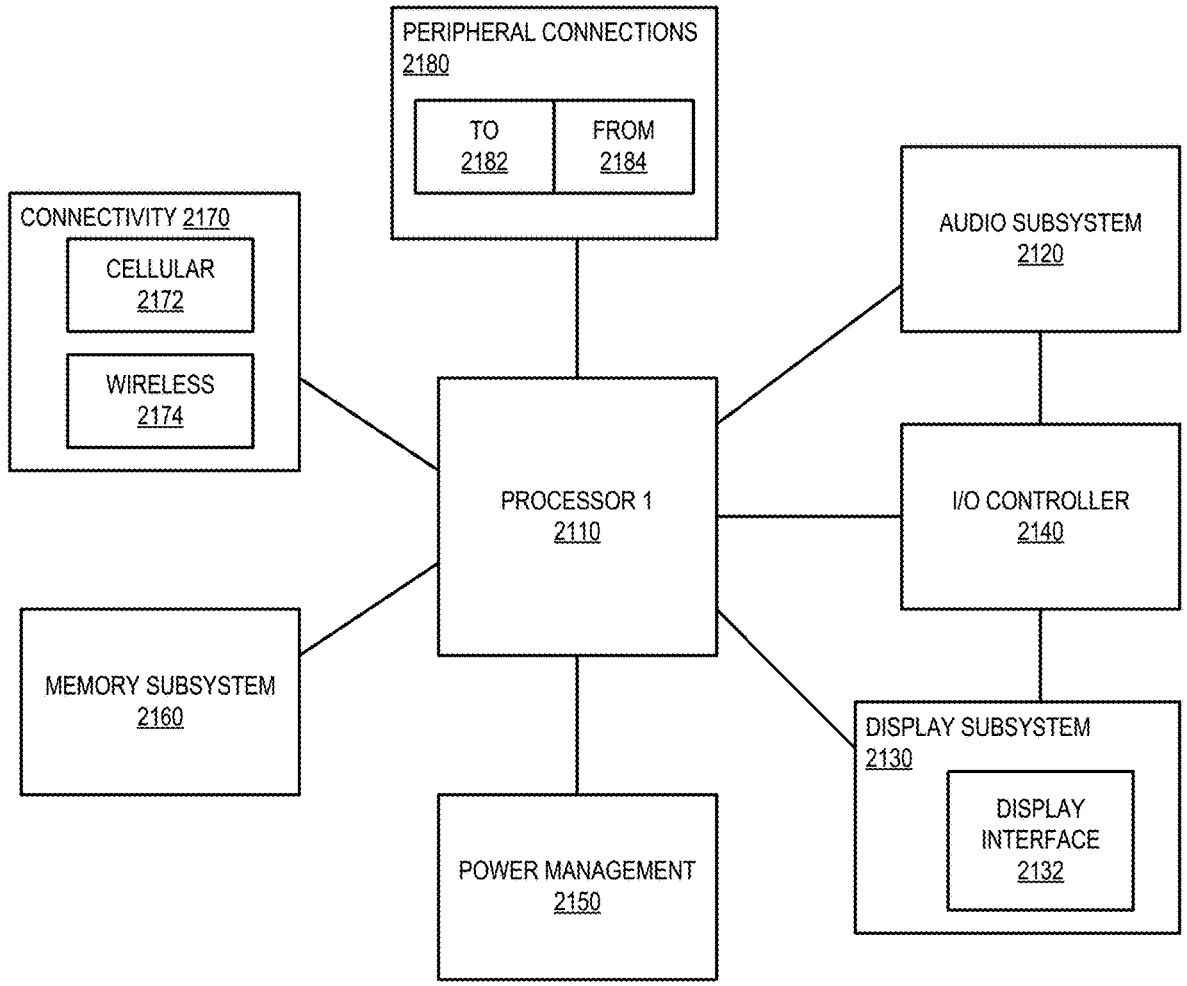
FIG. 10 illustrates a smart device or a computer system or a SoC (System-on-Chip) which includes a package with wall-side capacitors, according to some embodiments.

FIG. 10 illustrates a smart device or a computer system or a SoC (System-on-Chip) 2100 which includes a package with wall-side capacitors, according to some embodiments. In some embodiments, computing device 2100 represents a mobile computing device, such as a computing tablet, a mobile phone or smart-phone, a wireless-enabled e-reader, or other wireless mobile device. It will be understood that certain components are shown generally, and not all components of such a device are shown in computing device 2100. In some embodiments, one or more components of computing device 2100, for example processor 2110 and/or memory subsystem 2160, are included in a package with wall-side capacitors as described above.

For purposes of the embodiments, the transistors in various circuits and logic blocks described here are metal oxide semiconductor (MOS) transistors or their derivatives, where the MOS transistors include drain, source, gate, and bulk terminals. The transistors and/or the MOS transistor derivatives also include Tri-Gate and FinFET transistors, Gate All Around Cylindrical Transistors, Tunneling FET (TFET), Square Wire, or Rectangular Ribbon Transistors, ferroelectric FET (FeFETs), or other devices implementing transistor functionality like carbon nanotubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used without departing from the scope of the disclosure.

In some embodiments, computing device 2100 includes a first processor 2110. The various embodiments of the present disclosure may also comprise a network interface within 2170 such as a wireless interface so that a system embodiment may be incorporated into a wireless device, for example, cell phone or personal digital assistant.

In one embodiment, processor 2110 can include one or more physical devices, such as microprocessors, application processors, microcontrollers, programmable logic devices, or other processing means. The processing operations performed by processor 2110 include the execution of an operating platform or operating system on which applications and/or device functions are executed. The processing operations include operations related to I/O (input/output) with a human user or with other devices, operations related to power management, and/or operations related to connecting the computing device 2100 to another device. The processing operations may also include operations related to audio I/O and/or display I/O.

In one embodiment, computing device 2100 includes audio subsystem 2120, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into computing device 2100, or connected to the computing device 2100. In one embodiment, a user interacts with the computing device 2100 by providing audio commands that are received and processed by processor 2110.

Display subsystem 2130 represents hardware (e.g., display devices) and software (e.g., drivers) components that provide a visual and/or tactile display for a user to interact with the computing device 2100. Display subsystem 2130 includes display interface 2132, which includes the particular screen or hardware device used to provide a display to a user. In one embodiment, display interface 2132 includes logic separate from processor 2110 to perform at least some processing related to the display. In one embodiment, display subsystem 2130 includes a touch screen (or touch pad) device that provides both output and input to a user.

I/O controller 2140 represents hardware devices and software components related to interaction with a user. I/O controller 2140 is operable to manage hardware that is part of audio subsystem 2120 and/or display subsystem 2130. Additionally, I/O controller 2140 illustrates a connection point for additional devices that connect to computing device 2100 through which a user might interact with the system. For example, devices that can be attached to the computing device 2100 might include microphone devices, speaker or stereo systems, video systems or other display devices, keyboard or keypad devices, or other I/O devices for use with specific applications such as card readers or other devices.

As mentioned above, I/O controller 2140 can interact with audio subsystem 2120 and/or display subsystem 2130. For example, input through a microphone or other audio device can provide input or commands for one or more applications or functions of the computing device 2100. Additionally, audio output can be provided instead of, or in addition to display output. In another example, if display subsystem 2130 includes a touch screen, the display device also acts as an input device, which can be at least partially managed by I/O controller 2140. There can also be additional buttons or switches on the computing device 2100 to provide I/O functions managed by I/O controller 2140.

In one embodiment, I/O controller 2140 manages devices such as accelerometers, cameras, light sensors or other environmental sensors, or other hardware that can be included in the computing device 2100. The input can be part of direct user interaction, as well as providing environmental input to the system to influence its operations (such as filtering for noise, adjusting displays for brightness detection, applying a flash for a camera, or other features).

In one embodiment, computing device 2100 includes power management 2150 that manages battery power usage, charging of the battery, and features related to power saving operation. Memory subsystem 2160 includes memory devices for storing information in computing device 2100. Memory can include nonvolatile (state does not change if power to the memory device is interrupted) and/or volatile (state is indeterminate if power to the memory device is interrupted) memory devices. Memory subsystem 2160 can store application data, user data, music, photos, documents, or other data, as well as system data (whether long-term or temporary) related to the execution of the applications and functions of the computing device 2100.

Elements of embodiments are also provided as a machine-readable medium (e.g., memory 2160) for storing the computer-executable instructions. The machine-readable medium (e.g., memory 2160) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 2170 includes hardware devices (e.g., wireless and/or wired connectors and communication hardware) and software components (e.g., drivers, protocol stacks) to enable the computing device 2100 to communicate with external devices. The computing device 2100 could be separate devices, such as other computing devices, wireless access points or base stations, as well as peripherals such as headsets, printers, or other devices.

Connectivity 2170 can include multiple different types of connectivity. To generalize, the computing device 2100 is illustrated with cellular connectivity 2172 and wireless connectivity 2174. Cellular connectivity 2172 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 2174 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 2180 include hardware interfaces and connectors, as well as software components (e.g., drivers, protocol stacks) to make peripheral connections. It will be understood that the computing device 2100 could both be a peripheral device ("to" 2182) to other computing devices, as well as have peripheral devices ("from" 2184) connected to it. The computing device 2100 commonly has a "docking" connector to connect to other computing devices for purposes such as managing (e.g., downloading and/or uploading, changing, synchronizing) content on computing device 2100. Additionally, a docking connector can allow computing device 2100 to connect to certain peripherals that allow the computing device 2100 to control content output, for example, to audiovisual or other systems.

In addition to a proprietary docking connector or other proprietary connection hardware, the computing device 2100 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, an apparatus is provided comprising: a plurality of dielectric layers forming a substrate; a plurality of first conductive contacts on a top surface of the substrate; a plurality of second conductive contacts on a bottom surface of the substrate opposite the top surface; a plurality of third conductive contacts on a side wall surface of the substrate perpendicular to the top and bottom surfaces; one or more discrete capacitor(s) coupled with the third conductive contacts on the side wall surface.

In some embodiments, the apparatus further comprises a substrate core within the dielectric layers. In some embodiments, the apparatus further comprises the one or more discrete capacitor(s) coupled with third conductive contacts on the side wall surface on opposite sides of the substrate core. In some embodiments, the apparatus further comprises the one or more discrete capacitor(s) arranged with a long edge perpendicular to the top and bottom surfaces. In some embodiments, the one or more discrete capacitor(s) comprise a surface-mount device (SMD). In some embodiments, the one or more discrete capacitor(s) comprise a 0402 package capacitor.

In another example, an apparatus is provided comprising: one or more integrated circuit die(s); and a substrate, wherein the substrate comprises: a plurality of dielectric layers; a plurality of first conductive contacts on a top surface of the substrate, wherein the first conductive contacts are coupled with the one or more integrated circuit die(s); a plurality of second conductive contacts on a bottom surface of the substrate; a plurality of third conductive contacts on a side wall surface of the substrate; and one or more discrete capacitor(s) coupled with the third conductive contacts on the side wall surface.

In some embodiments, the one or more discrete capacitor(s) comprise a height of greater than about 200 um. In some embodiments, the apparatus further comprises the one or more discrete capacitor(s) arranged horizontally. In some embodiments the one or more discrete capacitor(s) comprise a surface-mount device (SMD). In some embodiments the apparatus further comprises the one or more discrete capacitor(s) coupled with third conductive contacts on the side wall surface on opposite sides of a substrate core. In some embodiments the one or more discrete capacitor(s) comprises a 0402 package capacitor.

In another example a system is provided comprising: a display subsystem; a wireless communication interface; and an integrated circuit package, the integrated circuit package comprising: one or more integrated circuit die(s); and a substrate coupled with the die(s), wherein the substrate comprises: a plurality of organic dielectric layers; a plurality of first conductive contacts on a top surface of the substrate, wherein the first conductive contacts are coupled with the one or more integrated circuit die(s); a plurality of second conductive contacts on a bottom surface of the substrate; a plurality of third conductive contacts on a side wall surface of the substrate; and one or more discrete capacitor(s) coupled with the third conductive contacts on the side wall surface.

In some embodiments, the system further comprises a substrate core within the organic dielectric layers. In some embodiments, the system further comprises the one or more discrete capacitor(s) coupled with third conductive contacts on the side wall surface on opposite sides of the substrate core. In some embodiments, the system further comprises the one or more discrete capacitor(s) arranged horizontally. In some embodiments, the one or more discrete capacitor(s) comprise a surface-mount device (SMD). In some embodiments the one or more discrete capacitor(s) comprises a 0402 package capacitor.

In another example a method is provided comprising: forming a substrate, the substrate comprising: a plurality of dielectric layers forming a substrate; a plurality of first conductive contacts on a top surface of the substrate; a plurality of second conductive contacts on a bottom surface of the substrate; a plurality of third conductive contacts on a side wall surface of the substrate; and attaching one or more discrete capacitor(s) to the third conductive contacts on the side wall surface of the substrate.

In some embodiments, forming the plurality of third conductive contacts on a side wall surface of the substrate comprises: forming vias that extend beyond an imaginary reference line; and sawing along the imaginary reference line. In some embodiments, attaching one or more discrete capacitor(s) to the third conductive contacts on a side wall surface of the substrate comprises: plating the third conductive contacts with a solder paste; gluing the discrete capacitor in contact with the plated contacts; and heating the solder paste. In some embodiments, heating the solder paste comprises hot gas convection. In some embodiments, forming a plurality of organic dielectric layers comprises forming organic dielectric layers on a substrate core. In some embodiments, the method further comprises forming third conductive contacts on a side wall surface of the substrate that span the substrate core. In some embodiments, attaching one or more discrete capacitor(s) to the third conductive contacts on a side wall surface of the substrate comprises attaching a 0402 package capacitor to the third conductive contacts on a side wall surface of the substrate.

In another example an integrated circuit device package with wall-side capacitors is provided comprising: means of forming a substrate; a plurality of first conductive means to couple with a die on a top surface of the substrate; a plurality of second conductive means to couple with a printed circuit board on a bottom surface of the substrate; a plurality of third conductive means to couple with one or more discrete capacitor(s) on a side wall surface of the substrate; one or more discrete capacitor(s) coupled with the third conductive means on the side wall surface.

In some embodiments, the means for forming a substrate comprises a substrate core. In some embodiments, the device package further comprises the one or more discrete capacitor(s) coupled with third conductive means on the side wall surface on opposite sides of the substrate core. In some embodiments, the device package further comprises the one or more discrete capacitor(s) arranged horizontally. In some embodiments, the one or more discrete capacitor(s) comprise a surface-mount device (SMD). In some embodiments, the one or more discrete capacitor(s) comprise a 0402 package capacitor.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a plurality of dielectric layers on opposite sides of a metal core forming a substrate;
   a plurality of first conductive contacts on a top surface of the substrate;
   a plurality of second conductive contacts on a bottom surface of the substrate opposite of the top surface;
   a side wall surface of the substrate, the side wall surface of the substrate perpendicular to the top surface of the substrate;
   a plurality of third conductive contacts on the side wall surface of the substrate; and
   one or more discrete capacitor(s) coupled with a pair of the third conductive contacts on the side wall surface, wherein the pair of the third conductive contacts are present on opposite sides of the metal core.

2. The apparatus of claim 1, wherein the one or more discrete capacitor(s) comprise a surface-mount device (SMD).

3. The apparatus of claim 1, wherein the one or more discrete capacitor(s) comprises a 0402 package capacitor.

4. An apparatus comprising:
   one or more integrated circuit die(s); and
   a substrate, wherein the substrate comprises:
      a plurality of dielectric layers on opposite sides of a metal core;
      a top surface of the substrate;
      a plurality of first conductive contacts on the top surface of the substrate, wherein the first conductive contacts are coupled with the one or more integrated circuit die(s);
      a bottom surface of the substrate;
      a plurality of second conductive contacts on the bottom surface of the substrate;

a side wall surface of the substrate;
a plurality of third conductive contacts on the side wall surface of the substrate; and
one or more discrete capacitor(s) coupled with a pair of the third conductive contacts on the side wall surface, wherein the pair of the third conductive contacts are present on opposite sides of the metal core.

5. The apparatus of claim 4, wherein the one or more discrete capacitor(s) comprise a height of greater than about 200 um.

6. The apparatus of claim 4, wherein the one or more discrete capacitor(s) comprise a surface-mount device (SMD).

7. The apparatus of claim 4, wherein the one or more discrete capacitor(s) comprises a 0402 package capacitor.

8. A system comprising:
a display subsystem;
a wireless communication interface; and
an integrated circuit package, the integrated circuit package comprising:
one or more integrated circuit die(s); and
a substrate coupled with the die(s), wherein the substrate comprises:
a plurality of dielectric layers built upon opposite sides of a metal substrate core;
a plurality of first conductive contacts on a top surface of the substrate, wherein the first conductive contacts are coupled with the one or more integrated circuit die(s);
a plurality of second conductive contacts on a bottom surface of the substrate;
a plurality of third conductive contacts on a side wall surface of the substrate; and
one or more discrete capacitor(s) coupled with a pair of the third conductive contacts on the side wall surface, wherein the pair of the third conductive contacts are present on opposite sides of the metal core.

9. The system of claim 8, wherein the one or more discrete capacitor(s) comprise a surface-mount device (SMD).

10. The system of claim 8, wherein the one or more discrete capacitor(s) comprises a 0402 package capacitor.

11. A method comprising:
forming a substrate, the substrate comprising:
a plurality of dielectric layers;
a plurality of first conductive contacts on a top surface of the substrate;
a plurality of second conductive contacts on a bottom surface of the substrate; and
a plurality of third conductive contacts on a side wall surface of the substrate wherein forming the plurality of third conductive contacts on a side wall surface of the substrate comprises:
forming vias that extend beyond an imaginary reference line; and
severing along the imaginary reference line; and
attaching one or more discrete capacitor(s) to the third conductive contacts on the side wall surface of the substrate.

12. The method of claim 11, wherein attaching one or more discrete capacitor(s) to the third conductive contacts on a side wall surface of the substrate comprises:
plating the third conductive contacts with a solder paste;
coupling the discrete capacitor in contact with the plated contacts; and
heating the solder paste.

13. The method of claim 12, wherein heating the solder paste comprises hot gas convection.

14. The method of claim 11, wherein forming a plurality of dielectric layers comprises forming organic dielectric layers on a substrate core.

15. The method of claim 14, further comprising forming third conductive contacts on a side wall surface of the substrate that span the substrate core.

16. The method of claim 11, wherein attaching one or more discrete capacitor(s) to the third conductive contacts on a side wall surface of the substrate comprises attaching a 0402 package capacitor to the third conductive contacts on a side wall surface of the substrate.

* * * * *